United States Patent [19]
La Rosa

[11] Patent Number: 6,049,491
[45] Date of Patent: Apr. 11, 2000

[54] BITLINE BIAS CIRCUIT FOR NON-VOLATILE MEMORY DEVICES

[75] Inventor: Francesco La Rosa, Catania, Italy

[73] Assignee: STMicroelectronics S.r.l., Agrate Brianza (MI), Italy

[21] Appl. No.: 09/256,648

[22] Filed: Feb. 23, 1999

[30] Foreign Application Priority Data

Feb. 23, 1998 [IT] Italy .................................. MI98A0351

[51] Int. Cl.$^7$ .................................................. G11C 16/04
[52] U.S. Cl. .................. 365/189.09; 365/185.18
[58] Field of Search ................ 365/189.09, 189.11, 365/185.18, 185.33

[56] References Cited

U.S. PATENT DOCUMENTS

| | | | |
|---|---|---|---|
| 5,226,013 | 7/1993 | Secol et al. ...................... | 365/189.09 |
| 5,706,240 | 1/1998 | Fiocchi et al. ..................... | 365/189.09 |
| 5,768,206 | 6/1998 | McClure ............................ | 365/189.11 |
| 5,805,509 | 9/1998 | Leung et al. ....................... | 365/189.09 |
| 5,886,931 | 3/1999 | Hashiguchi ........................ | 365/189.09 |
| 5,907,510 | 5/1999 | Sheffield et al. ................... | 365/189.09 |

*Primary Examiner*—Trong Phan
*Attorney, Agent, or Firm*—Jenkens & Gilchrist, P.C.; Theodore E. Galanthay

[57] ABSTRACT

A bitline bias circuit, particularly for non-volatile memories, is disclosed. The bitline bias circuit includes an inverting stage which drives a first cascode transistor for biasing a selected bitline. A terminal of the first cascode transistor is fed back as an input to the inverting stage so as to form a first feedback loop. The bitline bias circuit further includes a second cascode transistor having a control terminal driven by the output of the inverting stage and a terminal which is fed back as an input to the inverting stage, thereby forming a second feedback loop. The feedback loops eliminate oscillations appearing on internal signals so as to reduce memory cell read cycle times.

21 Claims, 4 Drawing Sheets

BITLINE BIAS CIRCUIT FOR NON-VOLATILE MEMORY DEVICES

BACKGROUND OF THE INVENTION

1. Technical Field of the Invention

The present invention relates to a bitline bias circuit for non-volatile memories. More particularly, the invention relates to a bitline bias circuit for applications in non-volatile memories such as EPROMs, EEPROMs and FLASH EEPROMs.

2. Background of the Relevant Art

It is known that in non-volatile memory devices the binary information stored in a memory cell is read by comparing the current that flows across the cell in a specific bias condition with a reference current.

A bitline bias circuit is adapted to apply a preset voltage (i.e., approximately 1.0v on memory cells of the flash type) to the drain terminal of the memory cell during reading. The main characteristic that a bias circuit must possess is the ability to quickly stabilize at the operating point.

FIGS. 1a and 1b illustrate known bitline bias circuit configurations which use inverting stages formed by transistors M1, M2, M3 and M4 which control the cascode N-channel MOS field effect transistor M5. In FIGS. 1a and 1b, the reference numerals 1 and 1' designate bitline bias circuits, reference numeral 2 designates bitline selection devices, and reference numeral 3 designates a corresponding bitline.

The inverting stages shown in FIGS. 1a and 1b (formed, as mentioned, by the transistors M1–M5) form a NOR gate in which one input thereof is controlled by the input NOT_ENABLE which is used to enable/disable the circuit.

The known circuits shown in FIGS. 1a and 1b, however, entail the drawback of having a damped oscillating behavior during stabilization which limits the possibility to quickly reach a stable condition.

FIGS. 3a and 3b illustrate, respectively, the behavior of the bitline bias circuitry shown in FIGS. 1a and 1b, and clearly show that the signal CASC, which drives the gate terminal of the MOS field effect transistor M5, undergoes a damped oscillation before settling which disadvantageously delays signal CASC from reaching a stable condition. This overshooting behavior obviously delays the initial phase of reading data from a memory cell and accordingly slows the entire read cycle. In fact, accurate reading can begin only when the driving signal CASC of the MOS transistor M5 has fully stabilized.

SUMMARY OF THE INVENTION

The aim of the present invention is to provide a bitline bias circuit for non-volatile memories which eliminates the above-described oscillatory behavior and accordingly allows nodes of the bitline bias circuitry to reach a stable condition more quickly than experienced in known circuits.

Within the scope of this aim, an object of the present invention is to provide a bitline bias circuit having a greater phase margin than known circuits.

Another object of the present invention is to provide a bitline bias circuit, particularly for non-volatile memories, which allows a shorter memory read time.

Another object of the present invention is to provide a bitline bias circuit, particularly for non-volatile memories, which allows fast charging of the selected bitline without any oscillation.

Another object of the present invention is to provide a bitline bias circuit particularly for non-volatile memories which is highly reliable and relatively easy and inexpensive to manufacture.

This aim, these objects and others are achieved by a bitline bias circuit according to the present invention. The present bitline bias circuit is particularly suited for non-volatile memories and includes an inverting stage which is suitable for driving a first cascode transistor in order to bias a bitline. A source terminal of the first cascode transistor is fed back as an input to the inverting stage so as to form a first feedback loop. The bitline bias circuit further includes a second cascode transistor having a control terminal which is connected to the output of the inverting stage and a terminal which is fed back as an input for the inverting stage, thereby forming a second feedback loop. The two feedback loops limit internal nodes of the bitline bias circuit, such as CASC, from oscillating, thus improving read cycle times.

BRIEF DESCRIPTION OF THE DRAWINGS

Further characteristics and advantages of the present invention will become apparent from the following detailed description of a preferred but not exclusive embodiment thereof, illustrated only by way of non-limitative example in the accompanying drawings, wherein.

DETAILED DESCRIPTION OF THE PREFERRED EMBODIMENTS

Figure 1A:
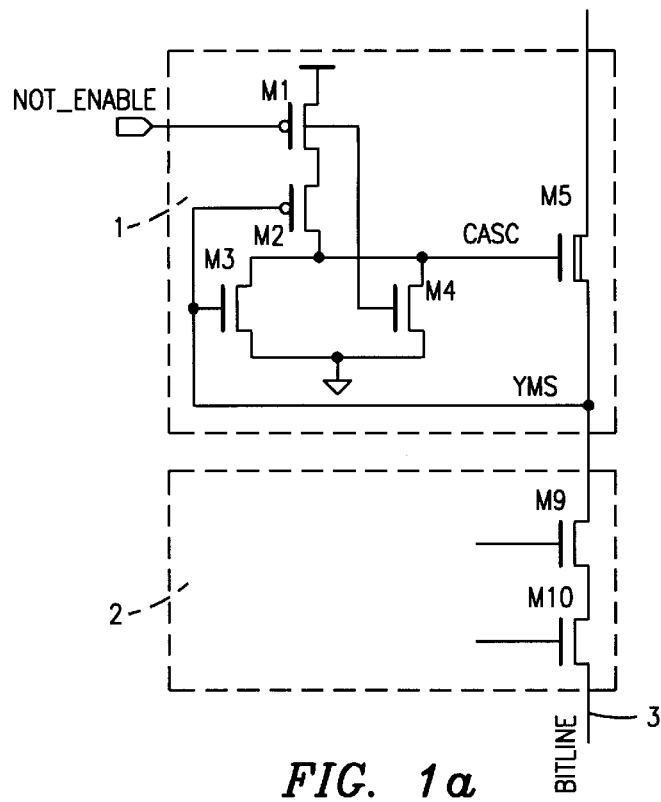
FIG. 1a is a circuit diagram of a conventional bitline bias circuit.
Figure 1B:
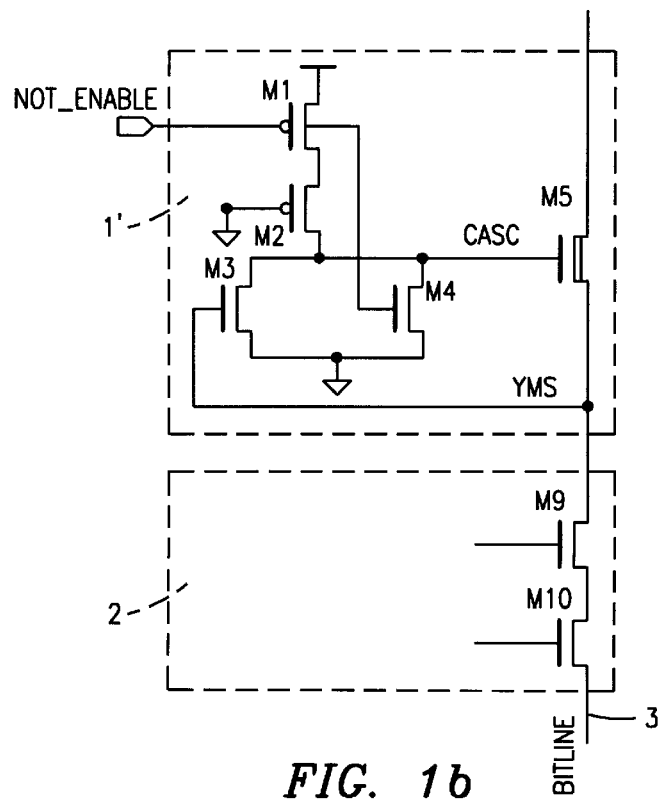
FIG. 1b is a circuit diagram of another conventional bitline bias circuit.
Figure 2:
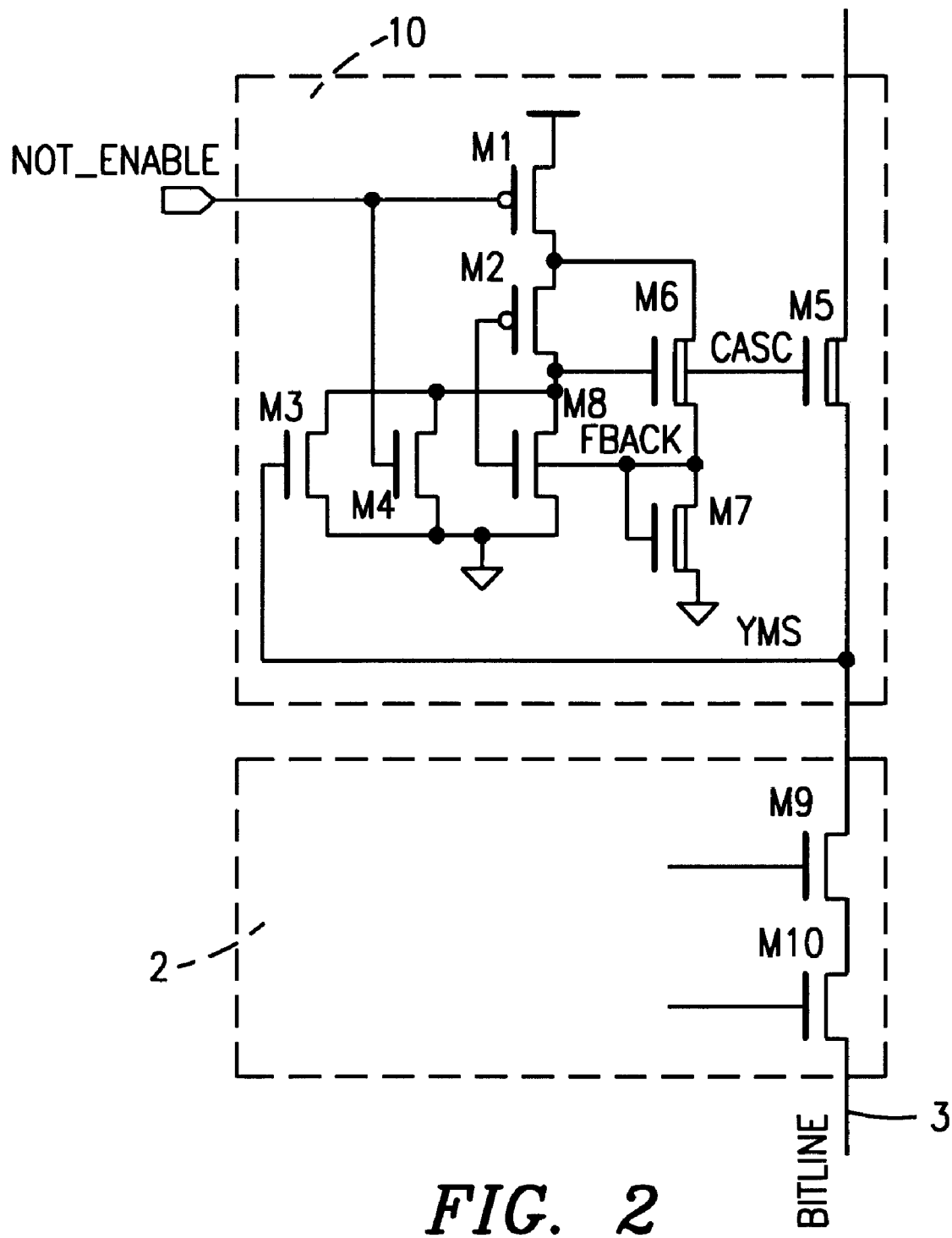
FIG. 2 is the circuit diagram of the bitline bias circuit according to the present invention.

FIGS. 1a and 1b are not described here in detail, since their circuit configuration will be shown in describing the circuit of FIG. 2, which illustrates an embodiment of a bitline bias circuit according to the present invention.

Referring to FIG. 2, and bearing in mind that in all the figures having identical reference numerals designate similar components, the circuit 10 according to the present invention comprises a logical inverting stage which is formed by the transistors M1–M5. In particular, a first pair of series-connected P-channel MOS field-effect transistors M1 and M2 is connected between a supply voltage and a second pair of parallel-connected N-channel MOS field-effect transistors M3 and M4. The source terminals of the second pair of transistors M3 and M4 are connected to the ground potential, the drain terminals thereof are connected to the drain terminal of the transistor M2.

An enable/disable signal NOT_ENABLE is an input to the inverting stage and drives the gate terminal of the transistors M1 and M4.

The gate terminal of the transistor M5 (a first cascode MOS field-effect transistor) is driven by the inverting stage and connected to the drain terminal of the transistor M2. The source terminal of the transistor M5 is fed back to drive the gate terminal of the transistor M3.

A second cascode MOS field-effect transistor M6 is connected between the drain terminal of the transistor M1 and a drain terminal of a field-effect load transistor M7 having its source terminal tied to the ground. Transistors M6 and M7 form series-connected transistors connected between the drain terminal of transistor M1 and ground. The gate terminal of the load transistor M7 is connected to the drain terminal thereof.

The source terminal of the transistor M6 is fed back to drive the gate terminal of the transistor M2 and to the gate terminal of N-channel MOS field-effect transistor M8 which is connected in parallel relation with the second pair of transistors M3 and M4.

In this manner a first feedback loop and a second feedback loop are formed. The first feedback loop is formed by the feedback of the transistor MS to the gate terminal of transistor M3. The second feedback loop is formed by the feedback of the second cascode MOS transistor M6 to the transistors M2 and M8.

Series-connected transistors M9 and M10, as in the conventional circuits of FIGS. 1a and 1b, are connected to the cascode transistor M5.

In the circuit of FIG. 2, the signal FBACK represents the feedback signal from the transistor M6 for controlling the transistors M2 and M8, and the signal YMS represents the feedback signal for controlling the transistor M3.

Figure 3A:
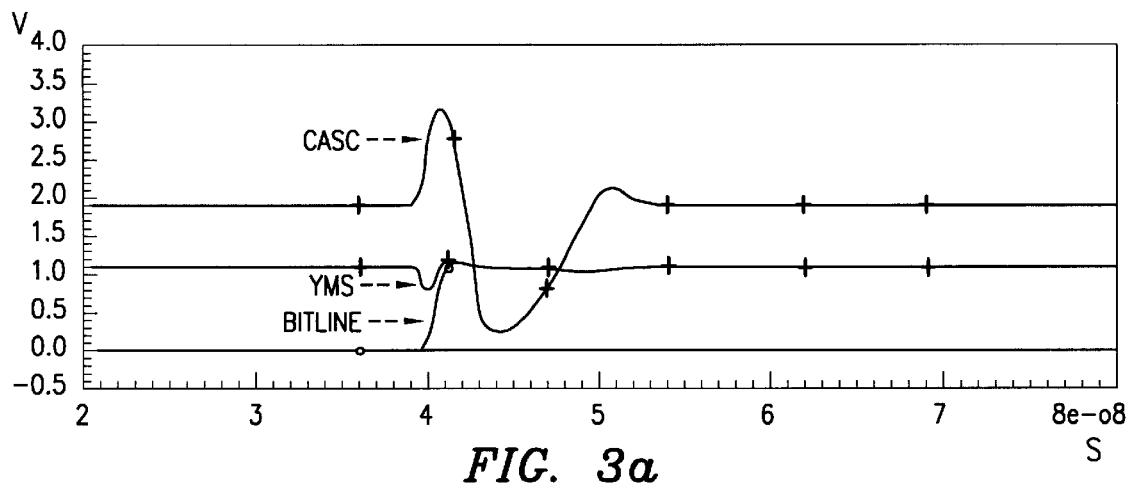
FIG. 3a is a graph illustrating the behavior of various signals of the circuit of FIG. 1.
Figure 3B:
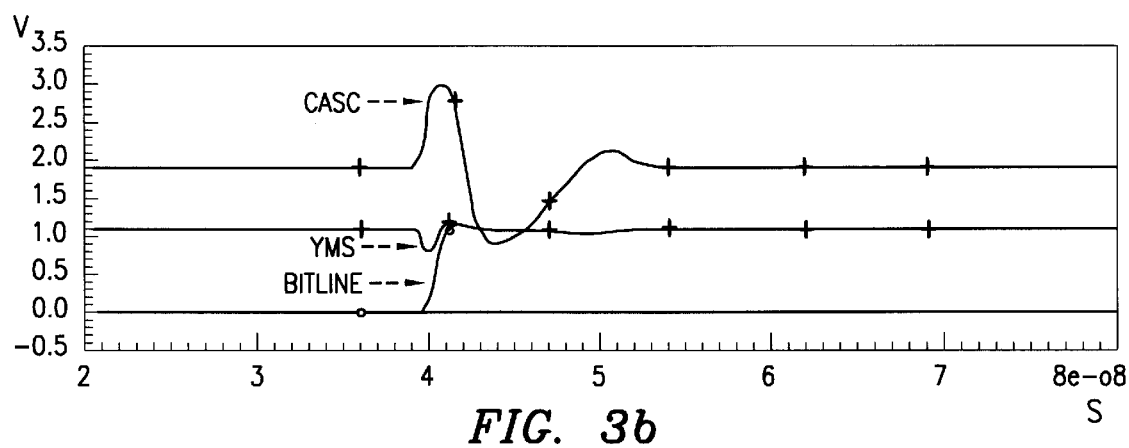
FIG. 3b is a graph illustrating the same signals illustrated in FIG. 3a in relation to the circuit of FIG. 1b.

FIGS. 3a and 3b show how the conventional circuits of FIGS. 1a and 1b respond to the selection of a bitline, which is assumed to be discharged before selection. It is evident that an accurate reading cannot be performed before the end of the damped oscillations that the signal CASC undergoes.

In the bitline bias circuit 10 of the present invention, the open-loop gain of the outer loop, i.e., of the loop formed by the feedback of the transistor M5 to the transistor M3, is limited by the inner loop, i.e., by the feedback of the transistor M6 to the transistor M8 and to the transistor M2.

Figure 3C:
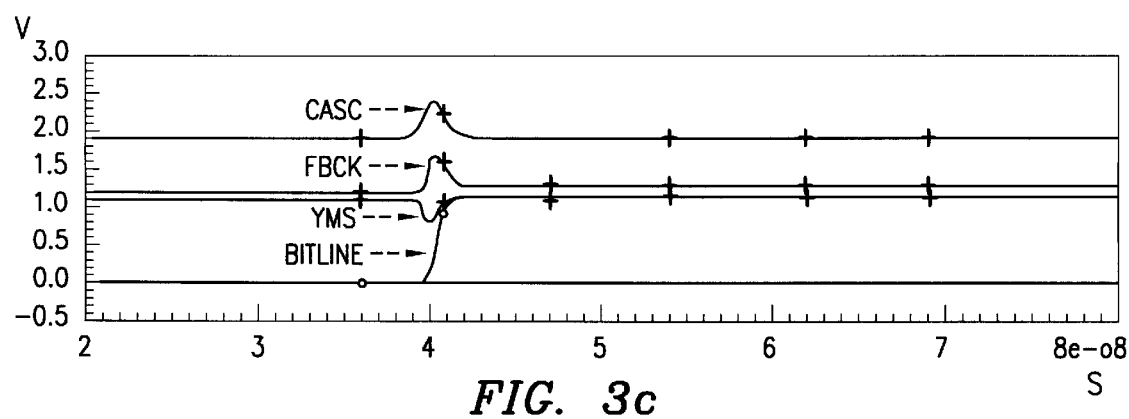
FIG. 3c is a graph illustrating the same signals illustrated in FIGS. 3a and 3b, in relation to the circuit of FIG. 2 according to the present invention.

FIG. 3c shows that as a response to the fall in voltage appearing on the signal YMS following the selection of a bitline, the voltage of signal CASC increases, which increases the voltage appearing on node FBACK. The voltage increase on FBACK limits overshooting of the node CASC by increasing the conductivity through transistors M8, thereby pulling CASC in the opposite direction (towards ground). Likewise, an increase in voltage on signal YMS lowers the voltage appearing on CASC, which lowers the voltage appearing on node FBACK. A lowering in voltage of node FBACK decreases the conductivity through transistor M8 and increases the conductivity through transistor M2, thereby tending to pull signal CASC in the opposite direction (towards Vcc) so as to foster quick stabilization of signal CASC.

By assigning appropriate dimensions to the transistors M3 and M8, it is possible to optimize the circuit in order to have quick charging of the bitline without any oscillation, as shown in FIG. 3c.

Figure 4A:
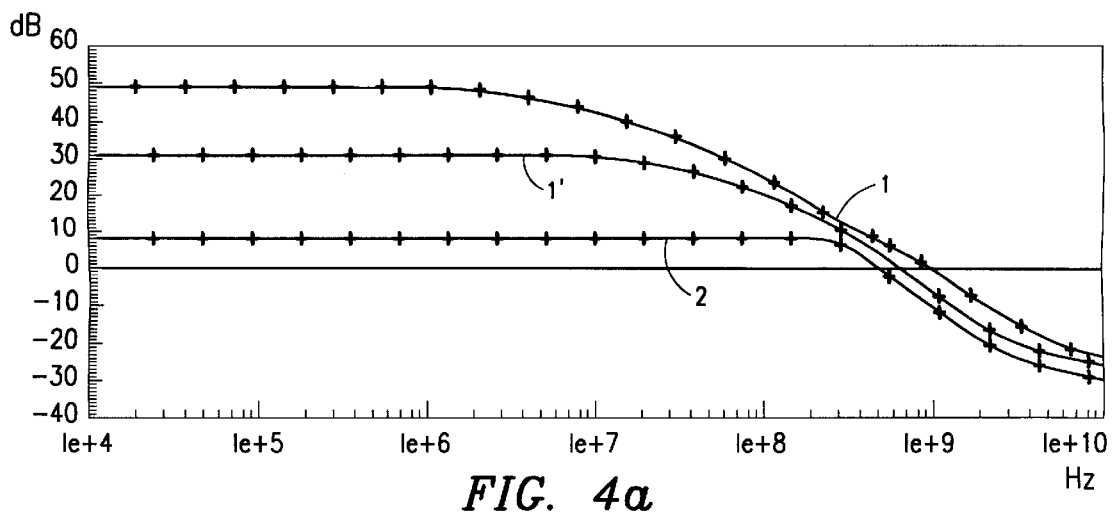
FIG. 4a is a graph illustrating a comparison between the magnitude of the frequency response of the circuits shown in FIGS. 1a, 1b and 2.
Figure 4B:
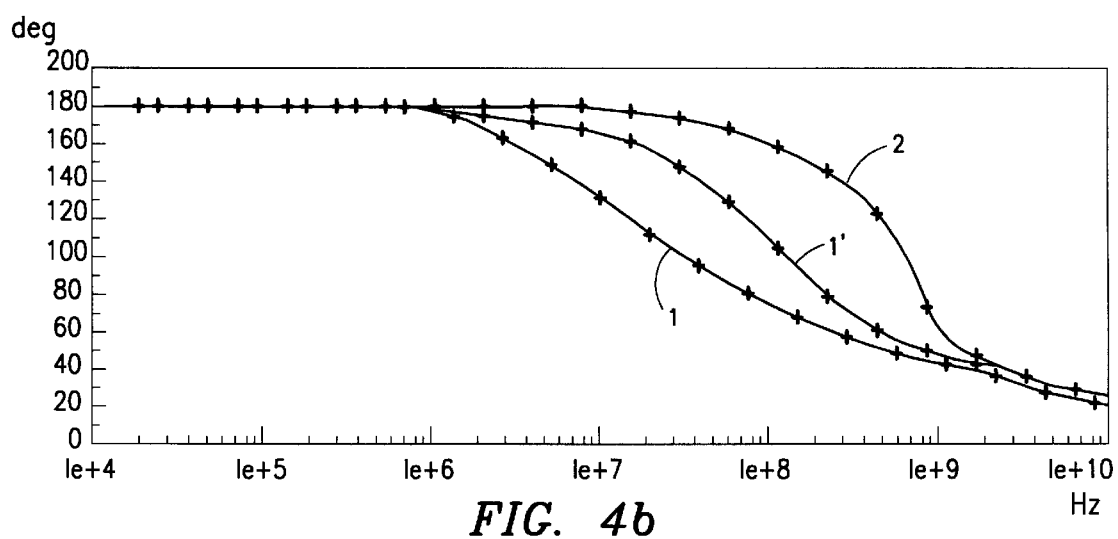
FIG. 4b is a graph of the phase of the frequency response of the circuits shown in FIGS. 1a, 1b and 2.

FIGS. 4a and 4b illustrate a comparison between the frequency response, expressed as magnitude and phase, respectively, of the open-loop gain of the known circuits shown in FIGS. 1a and 1b and the circuit according to the present invention, shown in FIG. 2. In FIGS. 4a and 4b, the reference numerals 1, 1' and 10 designate the behaviors of the circuits of FIGS. 1a, 1b and 2, respectively. As can be seen, the present bitline bias circuit advantageously has a higher phase margin so as to provide a better performance with respect to the known circuits of FIGS. 1a and 1b.

In practice it has been observed that the bitline bias circuit according to the present invention fully achieves the intended aim and objects, by eliminating the damped oscillations appearing on node CASC, thereby allowing faster stabilization and thus faster reading of the memory cells.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A bitline bias circuit, particularly for a semiconductor memory device, comprising:

an inverting stage having a first input driven by a selected bitline of the semiconductor memory device;

a first cascode transistor having a control terminal connected to the output of the inverting stage and a source terminal connected to the selected bitline and to the first input of the inverting stage so as to form a first feedback loop; and a second cascode transistor having a control terminal which is connected to the output of the inverting stage and a source terminal which is fed back to the inverting stage so as to form a second feedback loop.

2. The bitline bias circuit according to claim 1, wherein the inverting stage comprises:

a series-connected first pair of field-effect transistors of a first conductivity type, a source terminal of a first transistor in the first pair of field-effect transistors being connected to a first supply voltage and a drain terminal of a second transistor of the first pair of field-effect transistors being connected to the output of the inverting stage; and a parallel-connected second pair of field-effect transistors of a second conductivity type, source terminals of the second pair of field-effect transistors being connected to a ground potential and drain terminals thereof being connected to the output of the inverting stage.

3. The bitline bias circuit according to claim 2, wherein:

a gate terminal of the first transistor of the first pair of field-effect transistors and of a first transistor of the second pair of field-effect transistors is driven by a signal for selectively enabling the bitline bias circuit.

4. The bitline bias circuit according to claim 2, further comprising:

a first feedback transistor which is connected in parallel relation to the transistors of the second pair of field-effect transistors, a gate terminal of the first feedback transistor being connected to the gate terminal of the second transistor of the first pair of field-effect transistors.

5. The bitline bias circuit according to claim 4, wherein:

a drain terminal of the second cascode transistor is connected to the source terminal of the second transistor of the first pair of field-effect transistors; and a gate terminal of the second cascode transistor is connected to the gate terminal of the first cascode transistor.

6. The bitline bias circuit according to claim 5, wherein:

the source terminal of the second cascode transistor is fed back to the gate terminal of first feedback transistor.

7. The bitline bias circuit according to claim 5, further comprising:

a load transistor having a drain terminal and a gate terminal which are connected to the source terminal of the second cascode transistor.

8. The circuit according to claim 7, wherein the load transistor is an N-channel MOS transistor.

9. The circuit according to claim 2, wherein:

the transistors of the first pair of field-effect transistors are P-channel field-effect transistors.

10. The circuit according to claim 2, wherein:

the transistors of the second pair of field-effect transistors are N-channel field-effect transistors.

11. A circuit for biasing a bitline of a semiconductor memory device, comprising:

a first circuit for generating a control signal for controlling the electrical connection between the bitline and a current source, the control signal being based upon a voltage level appearing on the bitline so as to form a first feedback loop between the bitline and the first circuit; and a second circuit for receiving the control signal generated by the first circuit and driving a first input of the first circuit so as to form a second feedback loop therewith.

12. The circuit according to claim 11, wherein:

the second circuit includes a first transistor having a control terminal driven by the control signal of the first circuit, and a source terminal connected to the first input of the first circuit.

13. The circuit according to claim 12, wherein:

the first circuit includes a first transistor having a source terminal tied to a first supply voltage, a drain terminal connected to the control signal and a control terminal connected to the source terminal of the first transistor of the second circuit.

14. The circuit according to claim 12, wherein:

the first circuit includes a first transistor having a source terminal connected to a drain terminal of the first transistor of the second circuit, a control terminal connected to the source terminal of the first transistor of the second circuit thereof, and a drain terminal connected to the control signal.

15. The circuit according to claim 12, wherein:

the second circuit includes a second transistor having a source terminal connected to a first supply voltage, and a control terminal and a drain terminal connected to the source terminal of the first transistor of the second circuit.

16. The circuit according to claim 15, wherein:

the first transistor of the second circuit comprises a field-effect transistor of a first conductivity type; and the second transistor of the second circuit comprises a field-effect transistor of the first conductivity type.

17. The circuit according to claim 11, wherein:

the first circuit includes a first transistor having a control terminal connected to the bitline, a drain terminal connected to the control signal and a source terminal tied to a first supply voltage.

18. A bitline bias circuit for a semiconductor memory device, comprising:

a first circuit for generating a control signal for controlling the electrical connection between a selected bitline of the semiconductor memory device and a source; and feedback circuitry for eliminating oscillations appearing on the control signal, including a first feedback loop between the selected bitline and a first input to the first circuit and a second feedback loop between the control signal and a second input to the first circuit.

19. The bitline bias circuit according to claim 18, wherein:

the first circuit comprises at least one pull-up device of a first conductivity type and at least two parallel-connected pull-down devices of a second conductivity type; and the feedback circuitry comprises a first feedback transistor having a control terminal driven by the control signal generated by the first circuit, a first source/drain terminal connected to a source terminal of the at least one pull-up device, and a second source/drain terminal connected to a control terminal of the at least one pull-up device.

20. The bitline bias circuit according to claim 18, wherein:

the first circuit comprises at least one pull-up device of a first conductivity type and at least two parallel-connected pull-down devices of a second conductivity type; and the feedback circuitry comprises a first feedback transistor having a control terminal driven by the control signal generated by the first circuit, a first source/drain terminal connected to a source terminal of the at least one pull-up device, and a second source/drain terminal connected to a control terminal of one of the pull-down devices.

21. The bitline bias circuit according to claim 18, wherein:

the first circuit comprises at least one pull-up device of a first conductivity type and at least two parallel-connected pull-down devices of a second conductivity type; and the feedback circuitry comprises a first feedback transistor having a control terminal driven by the control signal generated by the first circuit, a first source/drain terminal connected to a source terminal of the at least one pull-up device, and a second source/drain terminal connected to a control terminal of one of the pull-down devices, and a second feedback transistor having a first source/drain terminal and a control terminal connected to the second source/drain terminal of the first feedback transistor and a second source/drain terminal tied to a supply voltage.

* * * * *